(12) United States Patent
Akondy Raja Raghupathi et al.

(10) Patent No.: US 11,264,972 B2
(45) Date of Patent: Mar. 1, 2022

(54) SYNCHRONIZING PULSE-WIDTH MODULATION CONTROL

(71) Applicant: Texas Instruments Incorporated, Dallas, TX (US)

(72) Inventors: Venkataratna Subrahmanya Bharathi Akondy Raja Raghupathi, Cypress, TX (US); Sam Gnana Sabapathy, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/133,403

(22) Filed: Dec. 23, 2020

(65) Prior Publication Data

US 2021/0336608 A1 Oct. 28, 2021

Related U.S. Application Data

(60) Provisional application No. 63/013,694, filed on Apr. 22, 2020.

(51) Int. Cl.
*H03K 3/017* (2006.01)
*G06F 1/08* (2006.01)
*H03K 21/02* (2006.01)

(52) U.S. Cl.
CPC ............... *H03K 3/017* (2013.01); *G06F 1/08* (2013.01); *H03K 21/02* (2013.01)

(58) Field of Classification Search
None
See application file for complete search history.

(56) References Cited

U.S. PATENT DOCUMENTS

2016/0176300 A1* 6/2016 Bucher ................... H02J 50/12
307/104

* cited by examiner

*Primary Examiner* — Cassandra F Cox
(74) *Attorney, Agent, or Firm* — Brian D. Graham; Charles A. Brill; Frank D. Cimino

(57) ABSTRACT

In described examples, a pulse width modulation (PWM) system includes an initiator and a receiver. The initiator includes an initiator counter and an initiator PWM signal generator. The initiator counter advances an initiator count in response to an initiator clock signal. The initiator PWM signal generator generates an initiator PWM signal in response to the initiator count. The receiver includes a receiver counter, a receiver PWM signal generator, and circuitry configured to reset the receiver count. The receiver counter advances a receiver count in response to a receiver clock signal. The receiver PWM signal generator generates a receiver PWM signal in response to the receiver count. The circuitry resets the receiver count in response to a synchronization signal and based on an offset.

22 Claims, 4 Drawing Sheets

SYNCHRONIZING PULSE-WIDTH MODULATION CONTROL

CROSS REFERENCE

This application is a non-provisional of, and claims priority to, U.S. Provisional Patent Application No. 63/013,694, filed on Apr. 22, 2020, which is hereby fully incorporated herein by reference.

TECHNICAL FIELD

This application relates generally to control systems, and more particularly to synchronization of pulse width modulation control systems distributed across a local network.

BACKGROUND

In many applications, such as industrial drive systems, it is important that various physically distributed control devices function synchronously to control respective devices to operate synchronously. For example, robotic systems, machine tools, and position controlled drive systems may incorporate multiple motors or actuators independently controlled by different ones of multiple respective controllers. Synchronized controllers enable motors and actuators to operate together to achieve coordinated movement to precise positions at precise times.

In some examples, synchronized controllers are distributed through a machine, vehicle, building, or other volume measurable in the tens of meters or less, and are connected over a communication network. The controllers may exchange control signals and sensor measurements via the communication network. Clock drift, variation in clock sources (which can result in accumulating clock discrepancies in separate controllers), clock generation error, and clock signal propagation differences (for example, software- or hardware-induced delays or transmission time differences) can desynchronize distributed controllers that otherwise rely on identical clock timing to maintain synchronization.

FIG. 1 shows an example functional block layout of a prior art pulse width modulation (PWM) controlled system 100. A primary PWM controller 102 is clocked by a primary global clock 104 (which may also be a global clock) and is connected to control a first PWM controlled device 106 (which can also be referred to as a power stage). The primary PWM controller 102 keeps a primary PWM count using the primary global clock 104, and uses the primary PWM count to generate PWM control signals to control the first PWM controlled device 106. Particularly in a duty cycle (time proportioning) PWM implementation, the state of the PWM signal between high and low is changed in response to the changing PWM count, for example setting the PWM signal low when the count reaches a first value and setting the PWM signal high when the count reaches a second value. (Alternatively, setting the PWM signal high when the count reaches the first value and setting the PWM signal low when the count reaches the second value.) Adjusting the first value changes the PWM duty cycle, which is the fraction of a PWM signal cycle during which the PWM signal is high (or low). Adjusting the second value corresponds to changing the counter maximum or modulo value, which determines the period of a PWM signal cycle. The primary PWM controller 102 can also be connected by a number N communications lines 108 to an isolation block 110. Use of an isolation block 11 can depend on, for example, whether device 106 is high or low voltage. The isolation block 110 includes capacitive, inductive, or optical impedances to isolate the primary PWM controller 102 from other electrical power regimes, such as different electrical power regimes applied to different PWM controllers. The isolation block 110 is connected by N communications lines 112 to a secondary PWM controller 114 that is clocked by a secondary global clock 116. The secondary PWM controller 114 is connected to control a second PWM controlled device 118. The secondary PWM controller 114 keeps a secondary PWM count using the secondary global clock 116, and uses the secondary PWM count to generate PWM control signals to control the second PWM controlled device 118.

SUMMARY

In described examples, a pulse width modulation (PWM) system includes an initiator and a receiver. The initiator includes an initiator counter and an initiator PWM signal generator. The initiator counter advances an initiator count in response to an initiator clock signal. The initiator PWM signal generator generates an initiator PWM signal in response to the initiator count. The receiver includes a receiver counter, a receiver PWM signal generator, and circuitry configured to reset the receiver count. The receiver counter advances a receiver count in response to a receiver clock signal. The receiver PWM signal generator generates a receiver PWM signal in response to the receiver count. The circuitry resets the receiver count in response to a synchronization signal and based on an offset.

DETAILED DESCRIPTION

Figure 1:
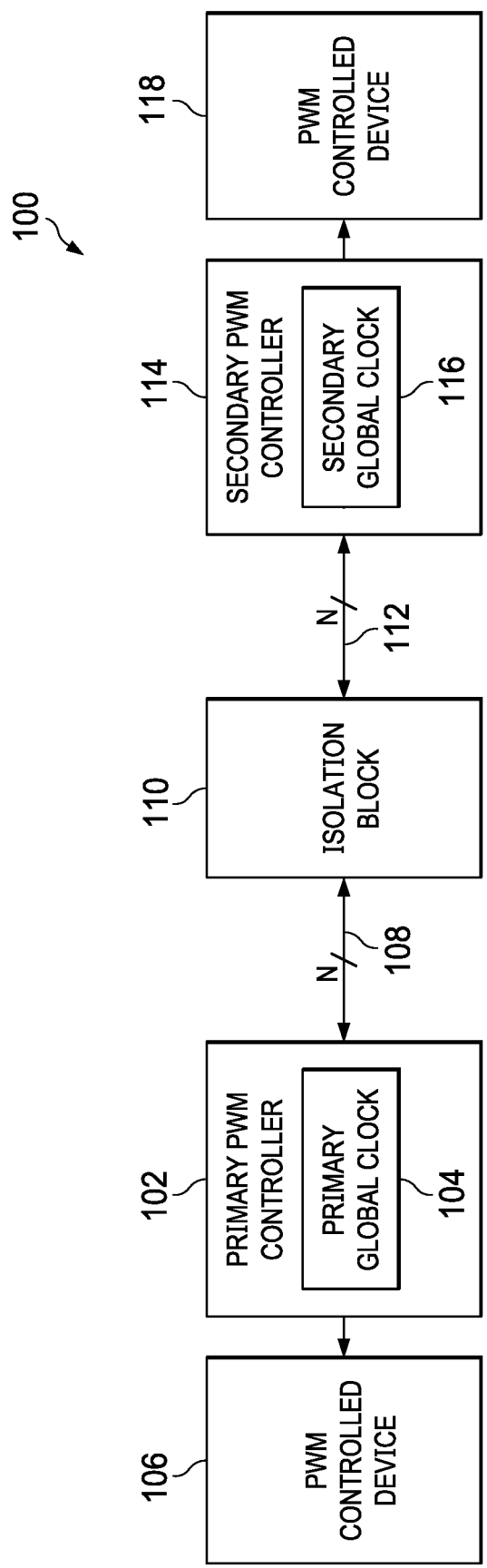
FIG. 1 shows an example functional block layout of a prior art synchronized pulse width modulation (PWM) controlled system.
Figure 2:
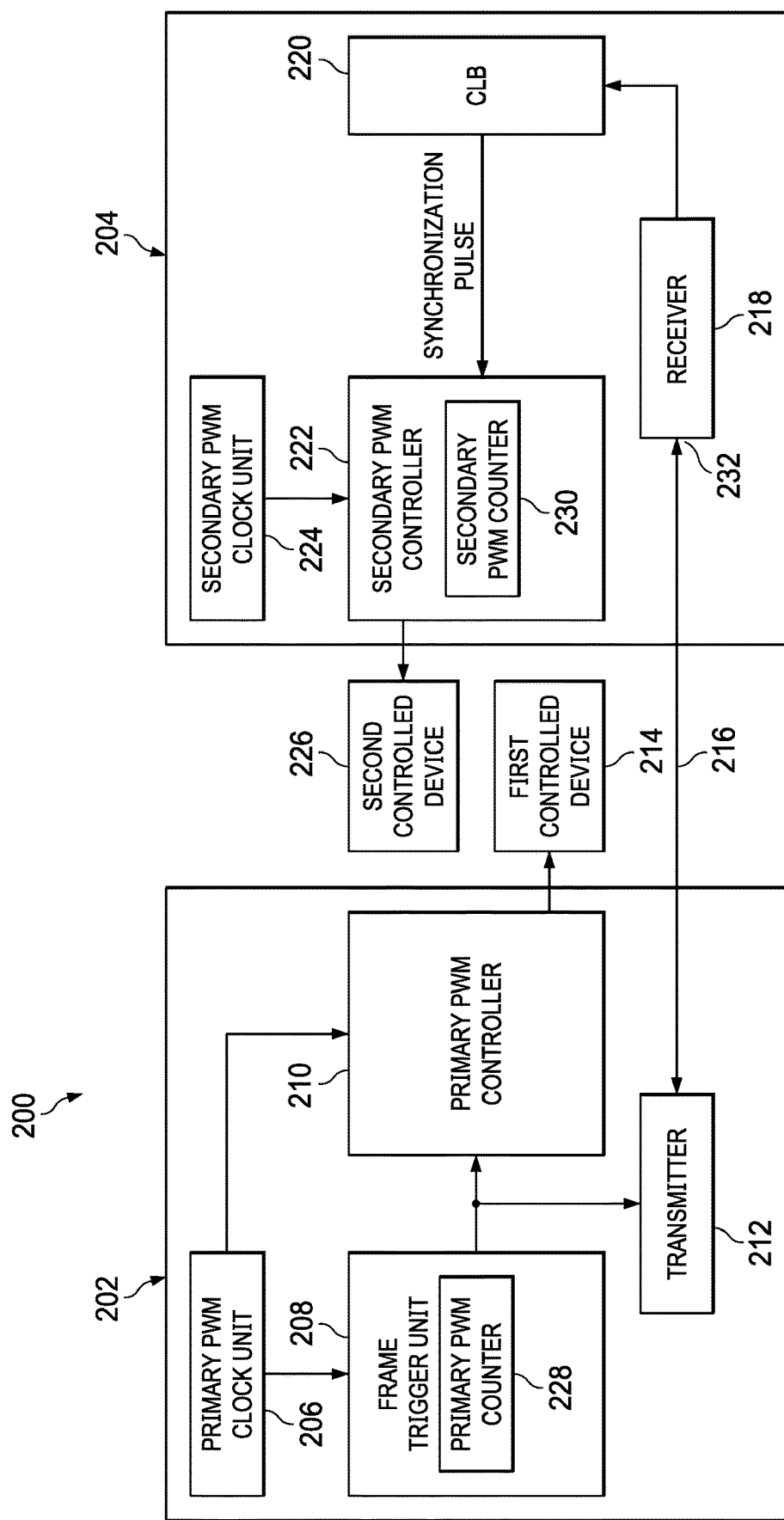
FIG. 2 shows an example functional block layout of a synchronized PWM controlled system.

FIG. 2 shows an example functional block layout of a synchronized PWM controlled system 200. The PWM controlled system 200 includes a primary module 202 (also called an initiator module) and a secondary module 204 (also called a receiver module). The primary module 202 includes a primary PWM clock unit 206 that generates a primary PWM clock signal and is connected to clock a frame trigger unit 208 and a primary PWM controller 210. The primary PWM clock signal can be, for example, generated from a primary global clock system (not shown). The frame trigger unit 208 is connected to output a synchronization pulse (further explained below) to the primary PWM controller 210 and a transmitter 212. The primary PWM controller 210 is connected to control a first controlled device 214. The transmitter 212 outputs to a communications line 216. The communications line 216 can be, for example, a bidirectional interconnect such as a fast serial interface (FSI). The communications line 216 can be bidirectional to allow data to also be transmitted over the communications line 216. Accordingly, the communications line 216 can be shared between data frame transmissions and synchronization frame transmissions (or transmissions of other frame types), and the input where the receiver 218 connects to the communications line 216 can be referred to as a shared input 232.

The secondary module 204 has a receiver 218 connected to receive frames (such as data frames or synchronization frames) from the communications line 216. The receiver 218 is connected to output received frames to a configurable logic block 220 (CLB 220), such as a field programmable gate array (FPGA) or dedicated digital logic. The CLB 220 is connected to output to a secondary PWM controller 222. A secondary PWM clock 224 is connected to clock the secondary PWM controller 222. The secondary PWM clock 224 can be, for example, generated from a secondary global clock system (not shown). The secondary PWM controller 222 is connected to control a second controlled device 226.

The primary PWM controller 210 includes a primary PWM counter 228 that generates a primary PWM count in response to a primary clock signal produced by the primary PWM clock unit 206. The primary PWM controller 210 uses the primary PWM count to generate a control signal to control the first controlled device 214. For example, the primary PWM clock unit 206 can operate at 100 MHz, while the primary PWM count is incremented at a rate of 20 kHz (such as once every five thousand rising clock edges). Accordingly, calculations and other processing functions in the primary module 202 and the secondary module 204 operate at higher rates relative to device control functions of the primary PWM controller 210 and secondary PWM controller 222, respectively, to improve precision of device control.

Accordingly, the control signal that operates the first controlled device 214 can be described as a PWM control signal. The frame trigger unit 208 detects pre-determined synchronization conditions under which a PWM count synchronization is to occur, and generates a synchronization pulse when a synchronization condition is detected. The frame trigger unit 208 generates a synchronization pulse in response to the primary PWM count, or other primary timer logic or spare PWM timer unit, reaching a pre-determined, hardware encoded value, which may be stored in programmable memory (e.g., non-volatile memory, fuses, etc.) of the frame trigger unit 208 or hardcoded into static logic of the frame trigger unit 208. Use of a pre-determined, hardware encoded value enables deterministic reset timing not dependent on timing variations typical to software layer execution, such as stalls and memory fetches. Accordingly, each synchronization pulse can be generated periodically. The frame trigger unit 208 outputs the synchronization pulse to the primary PWM controller 210 and the transmitter 212. In response to the synchronization pulse, the primary PWM controller 210 resets the primary PWM count to zero. In response to the synchronization pulse, the transmitter generates a synchronization frame (also called a PING frame), and transmits the synchronization frame via the communications line 216 to the receiver 218 of the secondary module 204.

The receiver 218 of the secondary module 204 outputs received frames (such as data frames and synchronization frames) to the CLB 220. The CLB 220 detects whether a received frame is a synchronization frame, such as by determining whether a frame includes a frame tag (a bit string) with a value corresponding to a synchronization frame. (Example structure of a synchronization frame is further described with respect to FIG. 4.) If the CLB 220 detects a synchronization frame, the CLB 220 sends a synchronization pulse to the secondary PWM controller 222.

The secondary PWM controller 222 includes a secondary PWM counter 230 that generates a secondary PWM count in response to the secondary PWM clock 224. The secondary PWM controller 222 generates a control signal to control the second controlled device 226 in response to the secondary PWM count. Accordingly, the control signal that operates the second controlled device 226 can be described as a PWM control signal. If the secondary PWM controller 222 receives a synchronization pulse, the secondary PWM controller 222 resets the secondary PWM count to zero plus an offset (also called a phase value).

The offset is encoded in hardware local to the secondary PWM controller 222, and the synchronization process is performed by a hardware layer, rather than a software layer. The offset is a memory variable and can be encoded, for example, in non-volatile memory or fuse logic. Avoiding software-related stalls, memory fetches, and other process-related delays enables synchronization timing to be deterministic, enhancing synchronization accuracy. The offset is determined in response to a physical distance between the primary module 202 and the secondary module 204. The offset can include the time taken for a serial bit stream corresponding variously to synchronization pulses and the synchronization frame to travel from the frame trigger unit 208, to the transmitter 212, through the communications line 216 to the receiver 218, to the CLB 220, to the secondary PWM controller 222. This propagation delay can be, for example, in the tens of nanoseconds, which can be added to the offset. Using a hardware layer to perform synchronization limits influence of variables other than transmission time, and enables the offset to be accurately determined in (further) response to circuit-based delay (to compensate for the circuit-based delay). Circuit-based delay (or latency) can include, for example, the time taken to initiate a frame transfer, the duration of the synchronization frame, the time taken by the CLB 220 to detect the synchronization frame, the time taken to perform the secondary PWM count reset, and other synchronization process-related delays.

Use of a hardware layer to perform synchronization using a synchronization frame and a transmission distance-related offset enables primary/secondary synchronization accurate to within, in some embodiments, a single cycle of the primary PWM clock signal. In embodiments in which the primary PWM clock unit 206 operates at 100 MHz, this can correspond to primary/secondary synchronization accurate to within 10 ns. Accordingly, in some embodiments in which devices controlled by the primary PWM count generated by the primary PWM counter 228, and the secondary PWM count generated by the secondary PWM counter 230, operate at a much lower frequency than the respective primary PWM clock unit 206 or secondary PWM clock unit 224 (for example, 20 kHz as opposed to 100 MHz), primary/secondary synchronization can be made highly accurate with respect to both the relatively lower frequency device control regime and the relatively higher frequency primary and secondary block 202, 204 operation regime.

From the preceding, the CLB 220 generated synchronization pulse resets the secondary PWM count generated by the secondary PWM counter 230 of the secondary PWM controller 222. That reset, along with the added offset, effectively sets the secondary PWM count to the same count, or nearly the same count, as the primary PWM count (generated by the primary PWM counter 228 of the primary PWM controller 210) at the time of the secondary PWM count reset. When the primary PWM count is reset and the synchronization frame is sent to the receiver 218 of the secondary module 204, by the time the secondary PWM count is reset to the offset, the primary PWM count also will have advanced by a number equal (or approximately equal) to that offset. Accordingly, the synchronization frame and resultant secondary reset synchronizes the primary and secondary PWM counts to within tolerances related to transmission-time and other process variability, such as variation due to temperature. By limiting the physical distance between the primary module 202 and the secondary module 204 to a few tens of meters, transmission-time variability can be limited so that synchronization resets the secondary PWM count more accurately to the same value as the primary PWM count at the time of secondary PWM count reset.

As described herein, PWM control systems can use a designated synchronization frame to synchronize PWM control modules across multiple devices to provide coordinated real-time control. This synchronization can be performed by transmitting synchronization frames over a bidirectional interconnect (such as the communications line 216) such as an FSI. Synchronization frames can be fit within relatively limited bandwidth, and accordingly, can be transmitted using shared communication lines while avoiding collision with other data being communicated.

Using a hardware-only layer to initiate communication transfer of a synchronization frame, and to receive and detect the synchronization frame, can avoid some or all software-related process interruptions, enabling reliably timed synchronization. By using a hardware layer and not using a software protocol layer to execute synchronization, the synchronization process can be executed deterministically. Using a hardware layer and not using a software protocol layer on execution also enables the synchronization process to avoid dependence on a central processing unit (CPU) or other software-controlled subsystem. Accordingly, using a hardware layer within a primary module 202 of a PWM network (such as PWM controlled system 200) to detect an event internal to the primary module 202 using a frame trigger unit 208, to generate a synchronization frame in response to detection of the internal event, and to synchronize the primary PWM module's 210 timer helps enable predictably timed synchronization events in PWM modules 210, 222 of the network. Also, using a hardware layer within a secondary module 204 of a PWM network to receive, detect, and respond to the synchronization frame helps enable predictably timed synchronization of PWM modules of the network.

A secondary module 204 of the PWM network can use hardware to detect received synchronization frames. A secondary module 204 generates a synchronization pulse in response to detected receipt of a synchronization frame. After the secondary PWM controller 222 within the secondary module 204 receives the synchronization pulse, a timer of the secondary PWM controller 222 is synchronized to the detected synchronization frame by resetting the secondary PWM controller's 222 secondary PWM count with an offset that corrects for frame latency. Accordingly, known (for example, measured) distances between primary and secondary PWM control modules 202, 204 (in some examples, with other delays, such as additional signal propagation delays as well as circuit-related delays internal to primary and secondary modules 202, 204 and corresponding primary and secondary PWM modules 210, 222) can be used to generate the offset to compensate, for example, for transmission delays caused by such distances.

The primary PWM count can be synchronized by resetting it to zero after the synchronization pulse is transmitted (or, for example, after the synchronization pulse is generated, or after initial detection of an event by the frame trigger unit 208—such as a predetermined primary PWM count value—triggering synchronization). The secondary PWM count can be synchronized by resetting it to zero plus the generated offset in response to the synchronization frame (or a pulse following detection of that frame). The generated offset can represent, for example, the latency between transmission of the synchronization frame and receipt of the synchronization frame, and other propagation delays of corresponding synchronization pulse(s). The generated offset can also include circuit delays of the secondary module 204 and the corresponding secondary PWM controller 222, as well as circuit delays between resetting of the primary PWM count and transmission of the synchronization frame.

Figure 3:
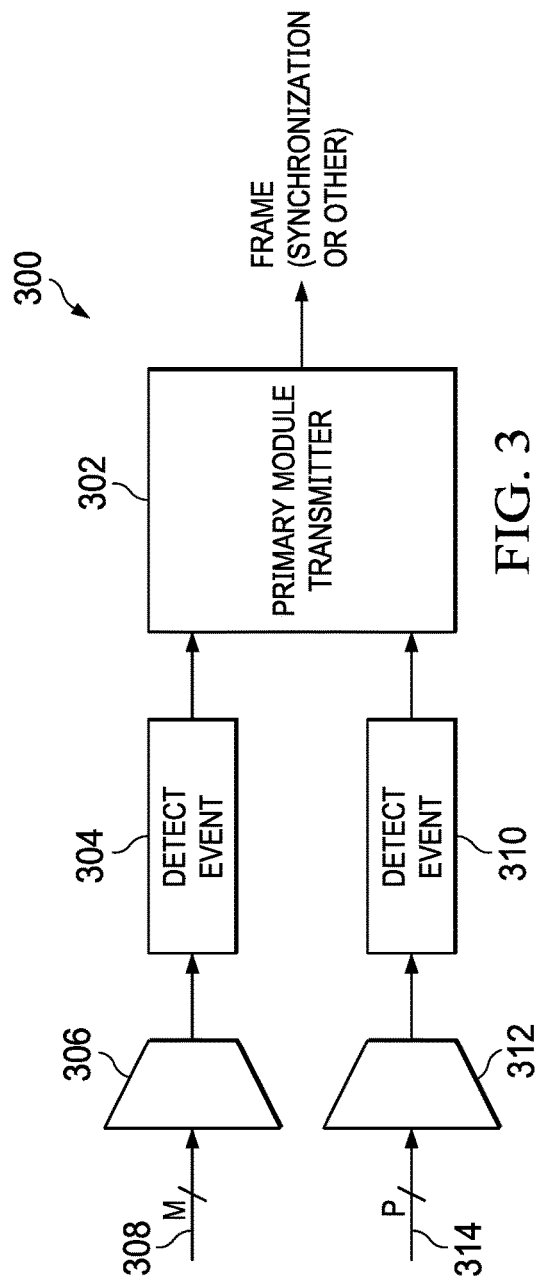
FIG. 3 shows an example functional block layout of an initiator portion of a synchronized PWM controlled system.

FIG. 3 shows an example functional block layout of an initiator portion of a synchronized PWM controlled system 300. A first input of a primary module transmitter 302 is connected to receive an output of a first detect event block 304. An input of the first detect event block 304 is connected to receive an output of a first multiplexer 306. The first multiplexer 306 has a number M inputs connected to M hardware layer trigger lines 308. A second input of the primary module transmitter 302 is connected to receive an output of a second detect event block 310. An input of the second detect event block 310 is connected to an output of a second multiplexer 312. The second multiplexer 312 has a number P inputs connected to P software layer trigger lines 314. The first and second detect event blocks 304, 310 and first and second multiplexers 306, 312 can correspond to the frame trigger unit 208 of FIG. 2.

The M hardware layer trigger lines 308 can be used to connect to M different internal (such as on-chip) or external hardware layer trigger sources (or both) to cause the primary module transmitter 302 to generate a synchronization frame. The first detect event block 304 determines whether the output of the first multiplexer 306 corresponds to a trigger event, or combination of trigger events, for generation of a synchronization frame by the primary module transmitter 302. If so, the first detect event block 304 sends a synchronization pulse to the primary module transmitter 302 to cause the primary module transmitter 302 to generate a synchronization frame.

The P software layer trigger lines 314 can be used to connect to P different internal or external software layer trigger sources (or both) for the primary module transmitter 302 to generate frames other than synchronization frames. The second detect event block 310 determines whether the output of the second multiplexer 312 corresponds to a trigger event, or combination of trigger events, for generation of a software-triggered non-synchronization frame by the primary module transmitter 302. If so, the second detect event block 312 sends a signal to the primary module transmitter 302 to cause the primary module transmitter 302 to generate a software initiated frame.

Figure 4:
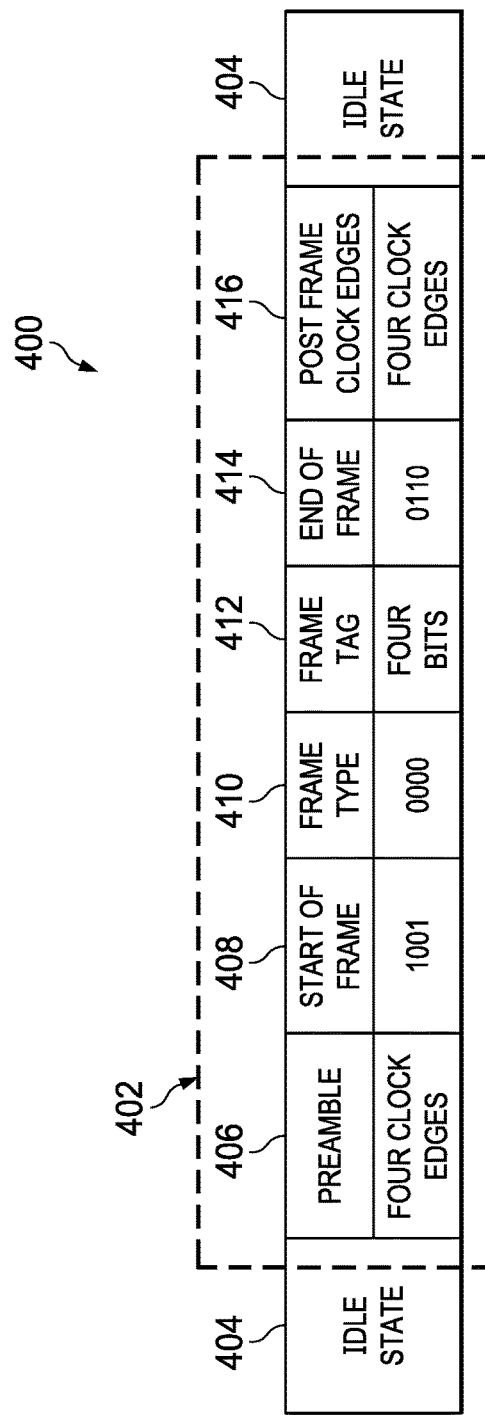
FIG. 4 shows an example synchronization frame bitwise layout.

FIG. 4 shows an example synchronization frame bitwise layout 400. Prior to the synchronization frame 402, the communications line 216 may be in (and the receiver 218 receives) an idle state 404. The presence of a frame is indicated by a preamble 406 of the synchronization frame 402. In the example of FIG. 4, the preamble 402 includes a number of clock edges that identify the frame 402, although any other suitable preamble may be used. The preamble 406 is followed, in order, by a start of frame 408, a frame type 410, a frame tag 412, an end of frame 414, and one or more post frame clock edges 416. The start of frame 408 indicates the beginning of the data portion of the frame. The frame type 410 indicates the type of the frame, from an enumerated list of possible frame types. The end of frame 414 indicates the end of the frame has been reached. (The particular values shown for these frame segments in FIG. 4 are merely illustrative.) After the post frame clock edges 416, which separate the frame from other signals on the communications line 216, the communications line 216 returns to an idle state 404 (or to subsequent content carried by the communications line 216).

The frame tag 412 is used to identify the frame as a synchronization frame 402. The frame tag 412 can be, for example, four bits, a particular value of which corresponds to a synchronization frame 402. The CLB 220 (FIG. 2) checks whether the frame tag 412 has the value corresponding to a synchronization frame 402 to detect the presence of a synchronization frame 402 or a non-synchronization frame. The CLB 220 detecting reception of a specific frame tag 412 by the receiver 418 helps to avoid software intervention by detecting the frame tag 412 automatically and with reduced, deterministic latency.

Figure 5:
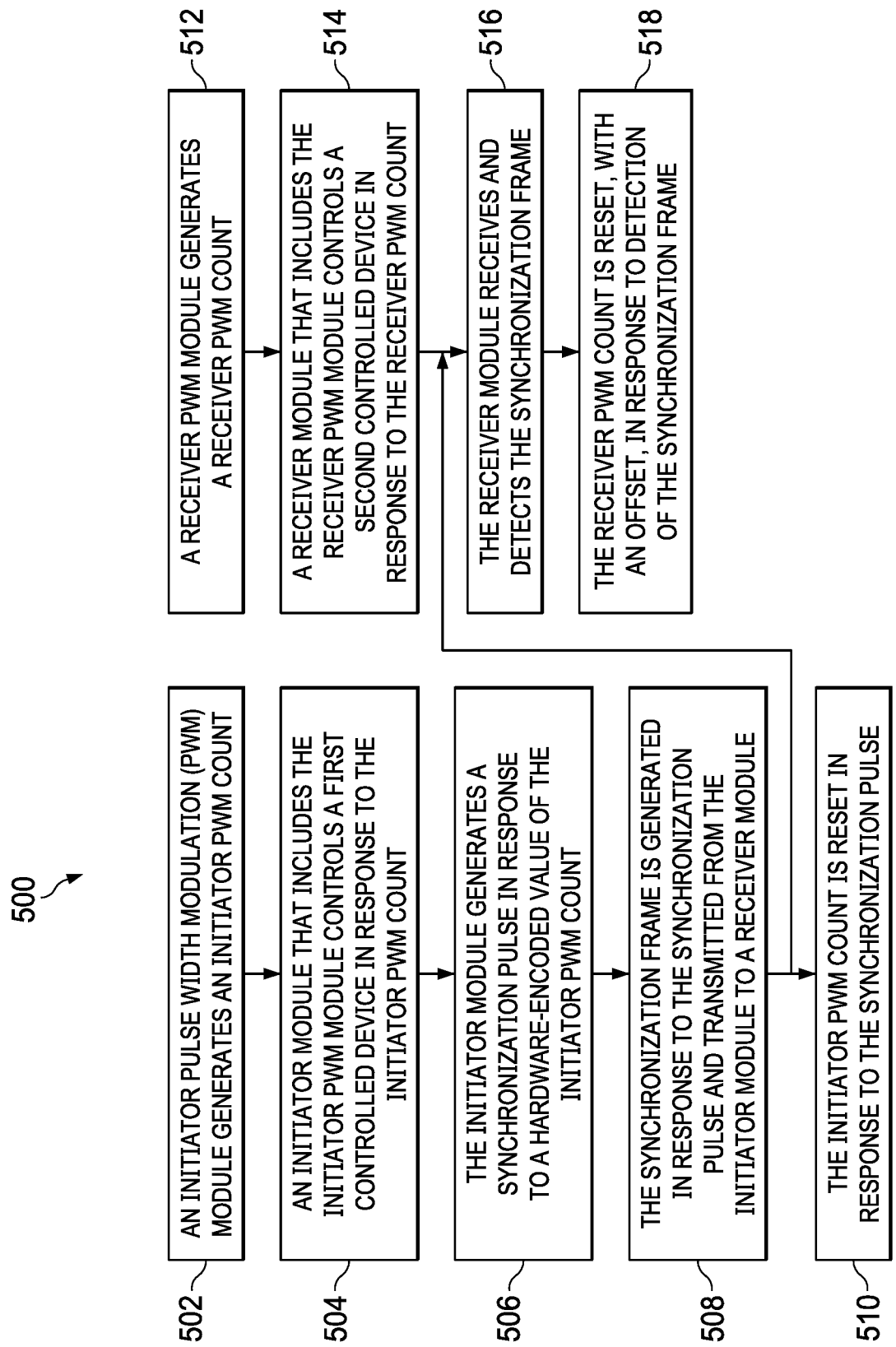
FIG. 5 shows an example of a synchronization process for a PWM controlled system.

FIG. 5 shows an example of a synchronization process 500 for a PWM controlled system. In step 502, an initiator PWM module (for example, the primary PWM controller 210, FIG. 2) generates an initiator PWM count. In step 504, an initiator module that includes the initiator PWM module controls a first controlled device in response to the initiator PWM count. In step 506, the initiator module generates a synchronization pulse in response to a hardware-encoded trigger, such as a value of the initiator PWM count. In step 508, a synchronization frame is generated in response to the synchronization pulse, and transmitted from the initiator module to a receiver module (for example, the secondary module 204, FIG. 2). In step 510, the initiator PWM count is reset in response to the synchronization pulse. In step 512, a receiver PWM module generates a receiver PWM count. In step 514, a receiver module that includes the receiver PWM module controls a second controlled device in response to the receiver PWM count. In step 516, the receiver module receives and detects the synchronization frame. In step 518, the receiver PWM count is reset, with an offset, in response to detection of the synchronization frame.

Modifications are possible in the described embodiments, and other embodiments are possible, within the scope of the claims.

In some embodiments, synchronization pulse(s) and synchronization frame(s) corresponding to a single synchronization event (for example, triggered by a single synchronization trigger) can together be referred to as a synchronization signal. For example, a synchronization pulse generated by a frame trigger unit, a synchronization frame transmitted from a primary module to a secondary module, and a synchronization pulse generated by a CLB in response to detecting the synchronization frame can together be referred to as a synchronization signal.

In some embodiments, the primary PWM count is incremented at a rate of 1 kHz to 1 MHz or more.

In some embodiments, an offset or a value to be added to an offset is transmitted as part of a synchronization frame. For example, a value corresponding to delay related to internal functioning of a primary module (process and propagation related delays) can be transmitted as part of a synchronization frame.

In some embodiments, communication line propagation delay can be determined from a data sheet of a corresponding cable, for example, as a number of nanoseconds per meter of cable.

In some embodiments, synchronized PWM counts are used to perform synchronized control of analog to digital converters (ADCs) and capture modules, and to synchronize execution of control algorithms. A capture module is a digital peripheral that accepts a digital pulse and measures the pulse width of incoming pulse signals.

In some embodiments, a primary module includes a single PWM controller that controls both a controlled device and the primary module's transmitter.

In some embodiments, the primary module and secondary module of FIG. 2 can be implemented using Texas Instruments Incorporated F28004x (Potenza) microcontrollers and other Texas Instruments Incorporated C2000 MCUs that include a fast serial interface.

In some embodiments, a primary PWM count is reset to an initial (or default) value other than zero in response to the synchronization pulse, and the secondary PWM count is reset to the (non-zero) initial (or default) value plus the offset in response to the synchronization pulse. In some embodiments, the initial value other than zero can be an offset corresponding to a delay between generation of the synchronization pulse and primary PWM count reset.

In some embodiments, a PWM count increments by one. In some embodiments, a PWM count increments by a number other than one. In some embodiments, a PWM count decrements. Incrementing the count and decrementing the count are both referred to herein as "advancing" the count. A count performed other than in response to a synchronization frame is referred to herein as "nominally" advancing the count.

In some embodiments, a primary PWM count does not reset in response to a synchronization frame. In some embodiments, a primary PWM count is included in a synchronization frame, and the secondary PWM count resets in response to the primary PWM count included in the synchronization frame and the offset. In some embodiments, a synchronization frame includes a default value, the primary PWM count is reset to the default value, and the secondary PWM count is reset to the default value plus the offset. In some embodiments, the primary PWM count is reset to a value based on the current primary PWM count (such as the primary PWM count rounded to a selected binary digit), and the secondary PWM count is reset to a value based on the current secondary PWM count (such as the secondary PWM count rounded to the selected binary digit) plus the offset.

FSI and configurable logic block peripherals are used herein for corresponding examples. In some embodiments, synchronization frames and offsets as described herein are implemented using other interfaces and hardware.

In some embodiments, transmitter 212 is connected via communications line 216 (or other communications lines 216) to receivers 218 of additional secondary modules 204, for example, in star or daisy chained topologies.

In some embodiments, other frame portions are used to indicate the synchronization frame. In some embodiments, a frame has a different bitwise layout.

In some embodiments, PWM control signals enable and disable controlled devices depending on logic values of the respective PWM control signals.

In some embodiments, distances between primary and secondary modules can be tens of meters or less. In some embodiments, distances between primary and secondary modules can longer.

In some embodiments, primary PWM count and secondary PWM count synchronization as described herein is applicable to various control regimes, for example, distributed motor axis control, and control of distributed power stages such as solar inverters/converters, AC/DC modules, and DC/DC modules.

What is claimed is:

1. A pulse width modulation (PWM) system, comprising:
an initiator, including:
an initiator clock signal input;
an initiator counter configured to advance an initiator count in response to an initiator clock signal received at the initiator clock signal input;
an initiator PWM signal generator configured to generate an initiator PWM signal in response to the initiator count; and
circuitry configured to generate and output a synchronization signal;
a receiver, including:
a receiver clock signal input;
a receiver counter for advancing a receiver count in response to a receiver clock signal received at the receiver clock signal input;
a receiver PWM signal generator configured to generate a receiver PWM signal in response to the receiver count; and
circuitry configured to reset the receiver count in response to the synchronization signal and based on an offset.

2. The PWM system of claim 1, wherein the offset is based on a physical distance between the receiver and the initiator.

3. The PWM system of claim 1,
wherein the initiator is configured to reset the initiator count to an initial value; and
wherein the receiver is configured to reset the receiver count to the initial value plus the offset.

4. The PWM system of claim 3,
wherein the initiator is configured to reset the initiator count in response to the synchronization signal or to a trigger that causes the generating of the synchronization signal; and
wherein the offset is determined in response to a physical distance between the initiator and the receiver.

5. The PWM system of claim 1, further comprising:
a communications line;
wherein the initiator is configured in a hardware execution layer to generate the synchronization signal, to output the synchronization signal to the communications line, and to reset the initiator count; and
wherein the receiver is configured in a hardware execution layer to receive the synchronization signal from the communications line, to detect the synchronization signal, and to reset the receiver count.

6. The PWM system of claim 1, wherein the initiator is configured to output data and the synchronization signal to a same communications line.

7. The PWM system of claim 1, wherein the initiator is hardware-configured to generate the synchronization signal in response to a trigger condition hardware-determined in the initiator and detected in a hardware execution layer of the initiator.

8. The PWM system of claim 1,
wherein the initiator is configured to output the initiator PWM signal as a first control signal; and
wherein the receiver is configured to output the receiver PWM signal as a second control signal.

9. A pulse width modulation (PWM) system, comprising:
a receiver, including:
a receiver input;
a receiver clock signal input;
a receiver counter for advancing a receiver count in response to a receiver clock signal received at the receiver clock signal input;
a receiver PWM signal generator configured to generate a receiver PWM signal in response to the receiver count; and
circuitry configured to reset the receiver count in response to receiving a synchronization signal at the receiver input and to a physical distance between the receiver and a transmission source of the synchronization signal.

10. The PWM system of claim 9,
wherein the receiver is configured to reset the receiver count to a pre-determined initial value plus an offset.

11. The PWM system of claim 10,
wherein the offset is determined in response to a circuit-based latency from the receiver input to a completion of the reset the receiver count action.

12. The PWM system of claim 10, wherein the receiver is configured to extract a first offset portion from the synchronization signal, and to add the first offset portion to a second offset portion stored in the receiver to generate the offset.

13. The PWM system of claim 9, wherein the receiver is configured in a hardware execution layer to detect the synchronization signal and to reset the receiver count in response to the detected synchronization signal.

14. The PWM system of claim 9, further comprising a communications line;
wherein the receiver input is coupled to the communications line;
wherein the receiver input is configured to receive the synchronization signal via the communications line; and
wherein the receiver input is configured to receive data via the communications line.

15. A method for pulse width modulation (PWM) control, comprising:
advancing, using an initiator, an initiator count in response to an initiator clock signal;
controlling a first controlled device, using the initiator, in response to the initiator count;
generating, using the initiator, a synchronization signal;
transmitting the synchronization signal from the initiator to a receiver;
advancing, using a receiver, a receiver count in response to a receiver clock signal;
controlling a second controlled device, using the receiver, in response to the receiver count;
receiving and detecting the synchronization signal using the receiver; and
resetting the receiver count, in response to the synchronization signal, based on an offset value.

16. The method of claim 15, wherein the offset value is based on a physical distance between the receiver and the initiator.

17. The method of claim 15, further comprising:
resetting the initiator count to an initial value;
wherein the resetting the receiver count includes resetting the receiver count to the initial value plus the offset value.

18. The method of claim 17,
wherein the resetting the initiator is in response to the synchronization signal or to a trigger that causes the generating of the synchronization signal; and
wherein the offset value is determined in response to a physical distance between the initiator and the receiver.

19. The method of claim 15,
using a hardware execution layer, in the initiator, to generate the synchronization signal, to transmit the synchronization signal to the receiver, and to reset the initiator count; and
using a hardware execution layer, in the receiver, to receive the synchronization signal, to detect the synchronization signal, and to adjust the receiver count by resetting the receiver count.

20. The method of claim 15, further comprising transmitting data from the initiator to the receiver using a same communications line as the transmitting the synchronization signal.

21. The method of claim 15, wherein the generating the synchronization signal is performed in response to a trigger hardware-determined in the initiator.

22. The method of claim 15, wherein the generating the synchronization signal is performed in response to a trigger condition hardware-determined in the initiator and detected in a hardware execution layer of the initiator.

* * * * *